United States Patent [19]

Engler et al.

[11] Patent Number: 4,988,668
[45] Date of Patent: Jan. 29, 1991

[54] TI-CA-BA-CU-D COMPOSITIONS ELECTRICALLY SUPERCONDUCTING ABOVE 120 DEGREES K AND PROCESSES FOR THEIR PREPARATION

[75] Inventors: Edward M. Engler; Victor Y. Lee; Adel I. Nazzal; Stuart S. P. Parkin, all of San Jose, Calif.

[73] Assignee: International Business Machines Corporation, Armonk, N.Y.

[21] Appl. No.: 327,203

[22] Filed: Mar. 22, 1989

Related U.S. Application Data

[62] Division of Ser. No. 165,330, Mar. 8, 1988, Pat. No. 4,870,052.

[51] Int. Cl.$^5$ .......................... C01F 11/02; C01G 3/02; C01G 15/00
[52] U.S. Cl. ........................................ 505/1; 252/521; 423/604; 423/624; 423/635; 501/123; 502/346; 505/783
[58] Field of Search ................... 505/1, 783; 252/521; 423/604, 624, 635; 501/123; 502/346

[56] References Cited

PUBLICATIONS

Robinson, "Effect of Oxidizing Atmosphere on Superconductivity in $Rba_2Cu_{3-x}M_xO_x$" *Mat. Res. Soc. Sump. Proc.* vol. 99, Nov./Dec. 1987, pp. 587–590.

Ovshinsky "Superconductivity at 155 K" to Phys. Rev. Lett. vol. 58, No. 24 Jun. 15, 1987, pp. 2579–2581.

Karpinski "High Purity Autoclaves (2.5 Kbar) for High Temp. Crystal ... " *Incl. of Crystal Growth* 79, 1986, pp. 477–483.

Ihara "Possibility of Superconductivity at 65° C. in Sr–Ba–Y–Cu—O ... " Jap. Jnl of Applied Physics, vol. 26, No. 8, Aug. 1987, pp. L1413–L1415.

Hazen "100-K Superconducting Phases in the Ti–Ca–Ba–Cu–O System" *Phys. Rev. Lett.* vol. 60, No. 16, Apr. 18, 1988, pp. 1657–1660.

Weast *CRC Handbook of Chemistry and Physics* 1983, pp. B–41–42.

Hackh *Hackh's Chemical Dictionary* 1938, pp. 929–930.

Primary Examiner—Paul Lieberman
Assistant Examiner—John Boyd
Attorney, Agent, or Firm—Joseph G. Walsh

[57] ABSTRACT

Stable, bulk electrical superconductors are prepared by heating mixed metal oxides in the presence of oxygen in a closed vessel in a preheated oven for 1–5 hours at 850°–900° C. The final oxides are in the molar ratio $Ti_{0.6-1.1}Ca_{2-3}Ba_{0.75-1.25}Cu_{2-3}O_{(5+\delta)-(9+\delta)}$, where $\delta$ is less than one.

10 Claims, No Drawings

TI-CA-BA-CU-D COMPOSITIONS ELECTRICALLY SUPERCONDUCTING ABOVE 120 DEGREES K AND PROCESSES FOR THEIR PREPARATION

This is a division of application Ser. No. 165,330, filed Mar. 8, 1988, now U.S. Pat. No. 4,870,052.

TECHNICAL FIELD

The present invention is concerned with compositions which are stable, bulk electrical superconductors with zero resistance above 120° K., proven by magnetic susceptibility measurements.

BACKGROUND ART

The discovery of superconductivity above liquid nitrogen temperature (77° K.) in $Y_1Ba_2Cu_3O_y$ and related derivatives opens up the possibility for numerous applications in electrical and magnetic devices. The critical temperature for the transition from the normal metal state at high temperature to the superconducting state occurs in the range of 90°–95° K. Some of the properties and historical developments in this field are described by E. M. Engler in a review article (Chemtech, 17, 542 (1987)). The method of making these new superconductors which are a class of compounds known as perovskites is very important to being able to obtain the high temperature superconductivity (that is above 77° K.), and superior properties (for example, sharp transitions to zero resistance, bulk superconducting behavior). An earlier patent application by E. M. Engler et al. describes a method for fabricating improved superconducting materials based on Y and rare earth compounds of the general composition $M_1Ba_2Cu_3O_z$ where M equals Y or an appropriate rare earth element (U.S. patent application Ser. No. 07/024,653 filed Mar. 11, 1987.)

Many reports in the open literature (see for example references 12–18 cited in the first reference above) claim much higher temperature superconducting transitions in $Y_1Ba_2Cu_3O_y$ and its chemically modified derivatives and in some new compound variations. To our knowledge these results have not been confirmed with unambiguous and reproducible experimental characterization. Most reports are about resistance anomalies (that is, drops in electrical resistance) and not with zero electrical resistance which is needed for use of these materials in superconducting applications. Further, such observations are typically unstable where an initially observed electrical resistance anomaly disappears with time.

Press reports from Japan (H. Maeda from National Research Institute for Metals at Tsukuba, Jan. 21, 1988) and the U.S. (C. W. Chu cited in New York Times, Jan. 28, 1988, p. C2) claimed that the new oxide compounds of Bi-Sr-Ca-Cu of an undisclosed composition and processing procedure, show electrical resistance drops starting near 118° K., but not going to zero until 70°–80° K. Subsequently, we and other research groups confirmed these reports and demonstrated that a superconducting transition for a minor dispersed phase was occurring around 118° K., but that not enough of the phase was present to provide zero resistance (preprints by Parkin et al., Tarascon et al., Maeda et al., Torrance et al., Sunshine et al., Veblen et al., Hazen et al.) The major phase is the 70°–80° K. superconductor.

The Bi-Sr-Ca-Cu-O compound showed reproducible and bulk superconducting properties at about 80° K. which were confirmed by many research groups. However, the 118° K. phase remains a very minor fraction of the overall material and zero resistance had not been demonstrated. As with the 90° K. $Y_1Ba_2Cu_3O_y$ superconductors, Bi compounds require a specific processing procedure. In particular, the 118° K. resistance anomaly is very sensitive to the specific annealing temperatures and duration of heating used in its preparation.

Recently, we became aware of a preprint article (Hazen, Finger et al., "100K Superconducting Phases in the Tl-Ca-Ba-Cu-O System") which describes the preparation of two Tl-Ba-Ca-Cu oxide compositions which has a superconducting transition of 107° K., which unlike the Bi-compounds, dropped to zero resistance. We have repeated and confirmed these results. The processing conditions needed to make this thallium based superconductor have to be controlled even more carefully than for the earlier perovskite superconductors. Rapid heating for 5 minutes at 890° C. was claimed by Hazen, Finger et al. as necessary to stabilize the 107° K. superconductivity.

DISCLOSURE OF THE INVENTION

Stable, bulk electrical superconductors with zero resistance above 120° K., confirmed with magnetic susceptibility measurements have now been prepared from the elements thallium, calcium, barium, copper and oxygen. Although these are the same elements in the compositions reported by Hazen, Finger et al., mentioned above, both the relative amounts of the elements and the process conditions are different. These differences are necessary to provide superconductivity above 120° K. According to the present invention, the materials in the form of oxides are mixed together and heated in a preheated oven in a closed vessel in the presence of oxygen for from 1–5 hours at a temperature from 850°–900° C. The heating is followed by cooling to room temperature over a period of 1–5 hours. The metals are present at the beginning of the process in the ratio $Tl_{0.75-1.25}Ca_{2-3}Ba_{0.75-1.25}Cu_{2-3}$.

In the case of barium, either barium oxide or barium peroxide can be employed as the starting material. Barium peroxide is preferred.

The preparation of the superconductor is carried out in a closed vessel. It is most preferred that the closed vessel be a sealed quartz vessel. The sample of the admixed metal oxides is held in a crucible, made for example from gold, silver, platinum, aluminum oxide or zirconium oxide and sealed inside the quartz vessel. Even when the reaction is carried out in a sealed vessel, approximately 20% of the thallium is lost due to volatilization and reaction with the quartz. There is some indication that perhaps this reaction with the quartz helps the reaction to go in the desired way. In any case, it is preferred that the closed vessel be a sealed quartz one.

It should be emphasized that when the compositions specified by Hazen, Finger et al., mentioned in the reference cited above are employed, zero resistance is not obtained above 107° K. These authors also reported it was necessary to use prereacted $BaCu_3O_4$ or $Ba_2Cu_3O_5$ as starting materials in their process. The use of these materials is not necessary in the process of the present invention.

The exact starting admixture of elements employed is important in achieving bulk electrical superconductors above 120° K. For example, when too much or too little thallium is used in the starting mixture, the desired results are not obtained. The other elements, barium, calcium and copper also have optimum ranges of compositions necessary but not as critical as thallium, for providing the best superconducting results. The preferred compositions cover the range of relative atomic ratios in the starting admixture of Tl from 0.75 to 1.25; Ca from 2 to 3; Ba from 0.75 to 1.25; and Cu from 2 to 3. Some examples of starting admixtures, that after processing as described in this application, do not provide bulk superconductors with zero resistance above 120° K. are: $Tl_2Ca_3Ba_1Cu_3$, $Tl_1Ca_1Ba_1Cu_2$, $Tl_2Ca_2Ba_2Cu_3$, $Tl_2Ca_1Ba_2Cu_2$. These examples are not meant to be inclusive, but only to illustrate the importance of the starting composition in stabilizing superconductivity above 120° K.

The heating should be carried out in the presence of oxygen. Oxygen at a pressure of approximately one atmosphere is preferred. It should be emphasized that the final oxygen content of the compositions is very susceptible to the process conditions.

A preferred starting composition has the metal elements present in the ratio $Tl_1Ca_3Ba_1Cu_3$. During processing, approximately 20% of the thallium is lost due to volatilization. The amount of oxygen present in this final composition is close to 50 atomic percent. This corresponds to a final elemental composition of $Tl_{0.8}Ca_3Ba_1Cu_3O_{8+\delta}$ where $\delta$ is less than one. Small variations in $\delta$ are not important for the occurrence of bulk superconductivity above 120° K.

The compositions of the final material are in the range $Tl_{0.6-1.1}Ca_{2-3}Ba_{0.75-1.25}Cu_{2-3}O_{(5+\delta)-(9+\delta)}$ where $\delta$ is less than one. The most preferred final composition is $Tl_{0.8}Ca_3Ba_1Cu_3O_{8+\delta}$ where $\delta$ is less than one. Another preferred example is $Tl_{0.8}Ca_2Ba_1Cu_3O_{7+\delta}$ where $\delta$ is less than one.

The compositions of the present invention exhibit bulk, electrical superconductivity. The materials are stable. The measurements indicate reproducibility of results. The materials are perovskite-like but they are not single phase; rather they are composites.

It is an essential aspect of the present application that the process for preparation is carefully followed. The oxides of the metals are admixed by ball milling, grinding or other mixing techniques, and sealed in a vessel, such as a quartz vessel, containing oxygen. They are placed in a preheated oven at a temperature between 850°–900° C. for 1–5 hours. The electrical measurements were carried out by the standard, low frequency, AC lock-in, four-probe technique. The materials showed a sharp drop of electrical resistance below the detection limit of $10^{-8}$ ohms at temperatures above 120° K. Proof that this resistance drop is actually due to bulk superconductivity, rather than filamentary or interfacial superconductivity, is demonstrated by magnetic susceptibility measurements showing substantial diamagnetic shielding and Meissner signal with sharp onsets at temperatures above 120° K.

Some specific starting compositions which are favored include: $Tl_{0.75}Ca_3Ba_1Cu_3$; $Tl_1Ca_{2.5}Ba_1Cu_3$; $Tl_1Ca_{2.5}Ba_1Cu_{2.5}$; $Tl_{1.25}Ca_3Ba_{1.25}Cu_3$; and $Tl_1Ca_2Ba_1Cu_2$. The most preferred are $Tl_1Ca_3Ba_1Cu_3$ and $Tl_1Ca_2Ba_1Cu_3$ where bulk superconductivity was reproducibly obtained at 125° K. which is, as far as we are aware, the highest ever obtained.

We claim:

1. A process for making stable, bulk, electrical superconductors with zero resistance above 120° K. confirmed with magnetic susceptibility measurements, said process comprising the steps of mixing the metal oxides in the ratio $Tl_{0.75-1.25}Ca_{2-3}Ba_{0.75-1.25}Cu_{2-3}$; forming into pellets which are placed in an inert crucible and sealed in a closed vessel in an oxygen atmosphere; heating in a preheated oven for 1–5 hours at 850°–900° C.; and cooling to room temperature over a period of 1–5 hours.

2. A process as claimed in claim 1 wherein the closed vessel is a sealed quartz vessel.

3. A process as claimed in claim 1 wherein the inert crucible is made of gold, platinum, silver, aluminum oxide or zirconium oxide.

4. A process as claimed in claim 1 wherein the metal oxides are in the ratio $Tl_1Ca_3Ba_1Cu_3$.

5. A process as claimed in claim 1 wherein the metal oxides are in the ratio $Tl_1Ca_2Ba_1Cu_3$.

6. A process as claimed in claim 1 wherein the metal oxides are in the ratio $Tl_{0.75}Ca_3Ba_1Cu_3$.

7. A process as claimed in claim 1 wherein the metal oxides are in the ratio $Tl_1Ca_{2.5}Ba_1Cu_3$.

8. A process as claimed in claim 1 wherein the metal oxides are in the ratio $Tl_{1.25}Ca_3Ba_{1.25}Cu_3$.

9. A process as claimed in claim 1 wherein the metal oxides are in the ratio $Tl_1Ca_2Ba_1Cu_2$.

10. A process as claimed in claim 1 wherein the metal oxides are in the ratio $Tl_1Ca_{2.5}Ba_1Cu_{2.5}$.

* * * * *

UNITED STATES PATENT AND TRADEMARK OFFICE
CERTIFICATE OF CORRECTION

PATENT NO. : 4,988,668
DATED : Jan. 29, 1991
INVENTOR(S) : Edward M. Engler et al.

It is certified that error appears in the above-identified patent and that said Letters Patent is hereby corrected as shown below:

On the Title page, and in col. 1, line 1,

"TI-CA-BA-CU-D"

should be:--TL-CA-BA-CU-O--

IN THE ABSTRACT:

Page 1, right column, beginning of line 25 (next to last line):

"Ti" should be --Tl--

Column 1, line 1: "TI-CA-BA-CU-D"

should be: --TL-CA-BA-CU-O--

Signed and Sealed this

Second Day of November, 1993

Attest:

BRUCE LEHMAN

Attesting Officer

Commissioner of Patents and Trademarks